United States Patent
Ramaswamy (10) Patent No.: US 8,384,456 B1
(45) Date of Patent: Feb. 26, 2013

(54) INTEGRATED PHASE-LOCKED AND MULTIPLYING DELAY-LOCKED LOOP WITH SPUR CANCELLATION

(75) Inventor: Sridhar Ramaswamy, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/300,143

(22) Filed: Nov. 18, 2011

(51) Int. Cl.
*H03L 7/06* (2006.01)
(52) U.S. Cl. .................... 327/158; 327/149
(58) Field of Classification Search ............. 327/147, 327/158
See application file for complete search history.

(56) References Cited

U.S. PATENT DOCUMENTS

| | | | |
|---|---|---|---|
| 6,982,579 B2 * | 1/2006 | Lee | 327/158 |
| 7,994,832 B2 * | 8/2011 | Ali et al. | 327/158 |
| 7,999,585 B2 * | 8/2011 | Kapusta et al. | 327/158 |
| 2005/0280407 A1 * | 12/2005 | Loke et al. | 324/76.54 |
| 2007/0001724 A1 * | 1/2007 | Na | 327/158 |
| 2010/0327925 A1 * | 12/2010 | Kapusta et al. | 327/158 |
| 2011/0002181 A1 * | 1/2011 | Rhee et al. | 365/194 |
| 2011/0109356 A1 * | 5/2011 | Ali et al. | 327/158 |
| 2012/0074996 A1 * | 3/2012 | Nagaraj et al. | 327/157 |

OTHER PUBLICATIONS

Flip-flop (electronics)—Wikipedia, the free encyclopedia, http://en.wikipedia.org/wiki/Flip-flop_(electronics), Oct. 28, 2011, pp. 1-15.

* cited by examiner

*Primary Examiner* — Adam Houston
(74) *Attorney, Agent, or Firm* — Alan A. R. Cooper; Wade James Brady, III; Frederick J. Telecky, Jr.

(57) ABSTRACT

A phase delay element coupled to an output of A multiplexor and a first input of the multiplexor. A reference clock line is coupled to a second input of the multiplexor. A selector that is coupled to a selector input of the multiplexor. A signal divider element coupled to an output of the phase delay element. A variable delay controller is coupled to a) the output of the variable delay controller; b) at least one output of the variable delay controller. An integrated phase detector and charge pump element (PDCHP) is coupled to at least: a) an output of the variable delay controller; and b) the selector; c) and a first and second output of the divider element. A capacitor is coupled to an output of the PDCHP, wherein the capacitor is also coupled to a controller input of the phase delay element.

20 Claims, 9 Drawing Sheets

INTEGRATED PHASE-LOCKED AND MULTIPLYING DELAY-LOCKED LOOP WITH SPUR CANCELLATION

TECHNICAL FIELD

This application is directed, in general, to a delay-locked loop, and, more specifically, to a delay-locked loop with spur cancellation.

BACKGROUND

Figure 1:
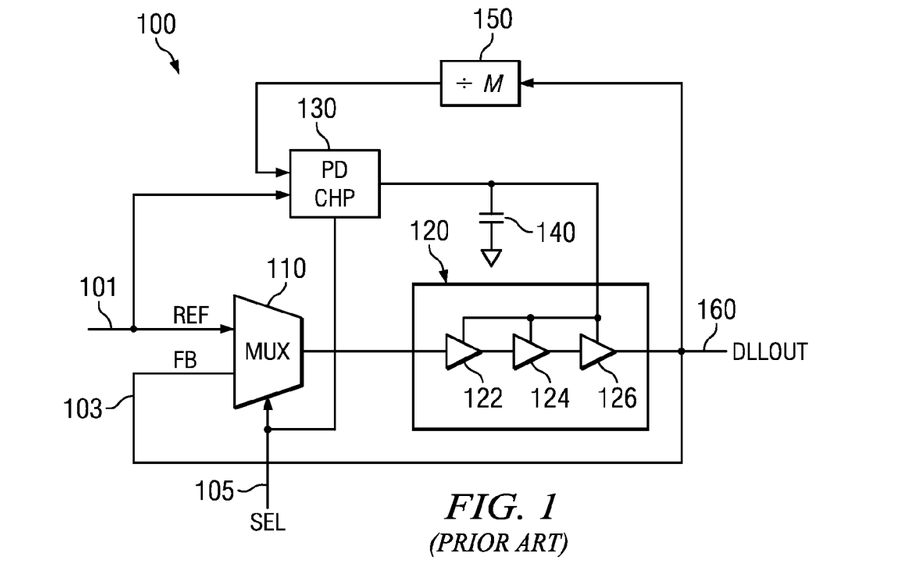
FIG. 1 illustrates an example of a first prior art MDLL.

Turning to FIG. 1, illustrated is a prior art multiplying delay locked loop (MDLL) 100. In the DLL 100, a reference clock line 101 and a feedback line 103 are coupled into a first and second input of a multiplexer (MUX) 110, respectively. An output signal of the MUX 110 is selected by a selector line 105. An output line of the MUX 110 is coupled into a delay circuit 120, having series-coupled phase delay elements 122, 124, and 126.

An output of the delay circuit 120 is DLLOUT 160. DLLOUT 160 is coupled into a divider circuit (divide-by-M) 150. An output of the divider circuit 150 is coupled into a first input of a phase detector/charge pump 130. The reference clock line 101 is also coupled into a second input of the phase detector/charge pump 130. An output of the phase detector/charge pump 130 is coupled to an cathode of a capacitor 140, an anode of which is coupled to ground. The cathode of the capacitor 140 is coupled to a signal input of the delay elements 160. A delay of the delay circuit 160 is proportional to a voltage measured across the capacitor 140.

Generally, the MDLL 100 can be used to multiply a frequency of a reference source (i.e., a clock signal on reference clock line 101) through employment of the divider circuit 150.

A primary advantage of MDLL over a "phase locked loop" (PLL) circuit is that a noise that is associated with a "voltage controlled oscillator" is not integrated within the MDLL 100, and therefore a lower "root mean square" (RMS) jitter occurs.

However, a disadvantage of the MDLL 100 is that a "static phase offset" jitter is typically higher than a PLL. A "static phase offset" can be generally defined an average difference in time between the phases of an input clock signal, such as input clock signal on reference clock line 101, and the corresponding phase of the DLLOUT 160. This static phase offset jitter can then result in undesired harmonics, i.e. a spur, at the output of the MDLL 100.

Various approaches towards reducing the "static phase offset" jitter has been taken in the prior art. One approach is that of a MDLL 200, such as described in "A DLL-Based Programmable Clock Multiplier in 01.8 um CMOS with −70 dBc Reference Spur" P. C. Maulik, et al. IEEE JSSC, Vol. 42, No. I, August 2007.

Figure 2:
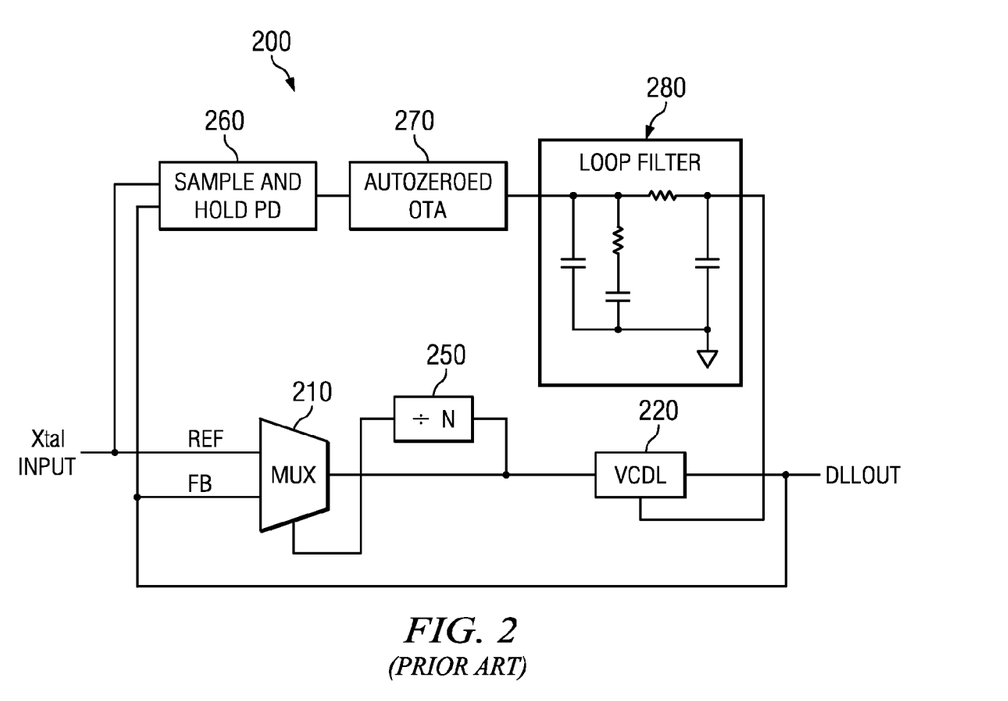
FIG. 2 illustrates an example of a second prior art MDLL.

In the prior art MDLL 200, a sample and hold phase detector 260, employs sampling to help reduce the "static phase offset between the REF and FB paths.

Also, the MDLL 200 employs an auto-zeroed trans conductance amplifier 270 instead of a charge pump.

Also, a loop filter 280 is coupled to an output of the an auto-zeroed trans conductance amplifier 270 instead of a charge pump. The sample and hold phase detector 260 is employed to measure very small phase errors between the reference and feedback clocks. The auto-zeroing transconductance amplifier 270 is employed to further reduce static phase offsets introduced due to input offsets in a simple single-ended amplifier. However, a main disadvantage with the above technique is the additional complexity and power dissipation due to the sample and hold and the auto-zero transconductance amplifier circuits.

Figure 3:
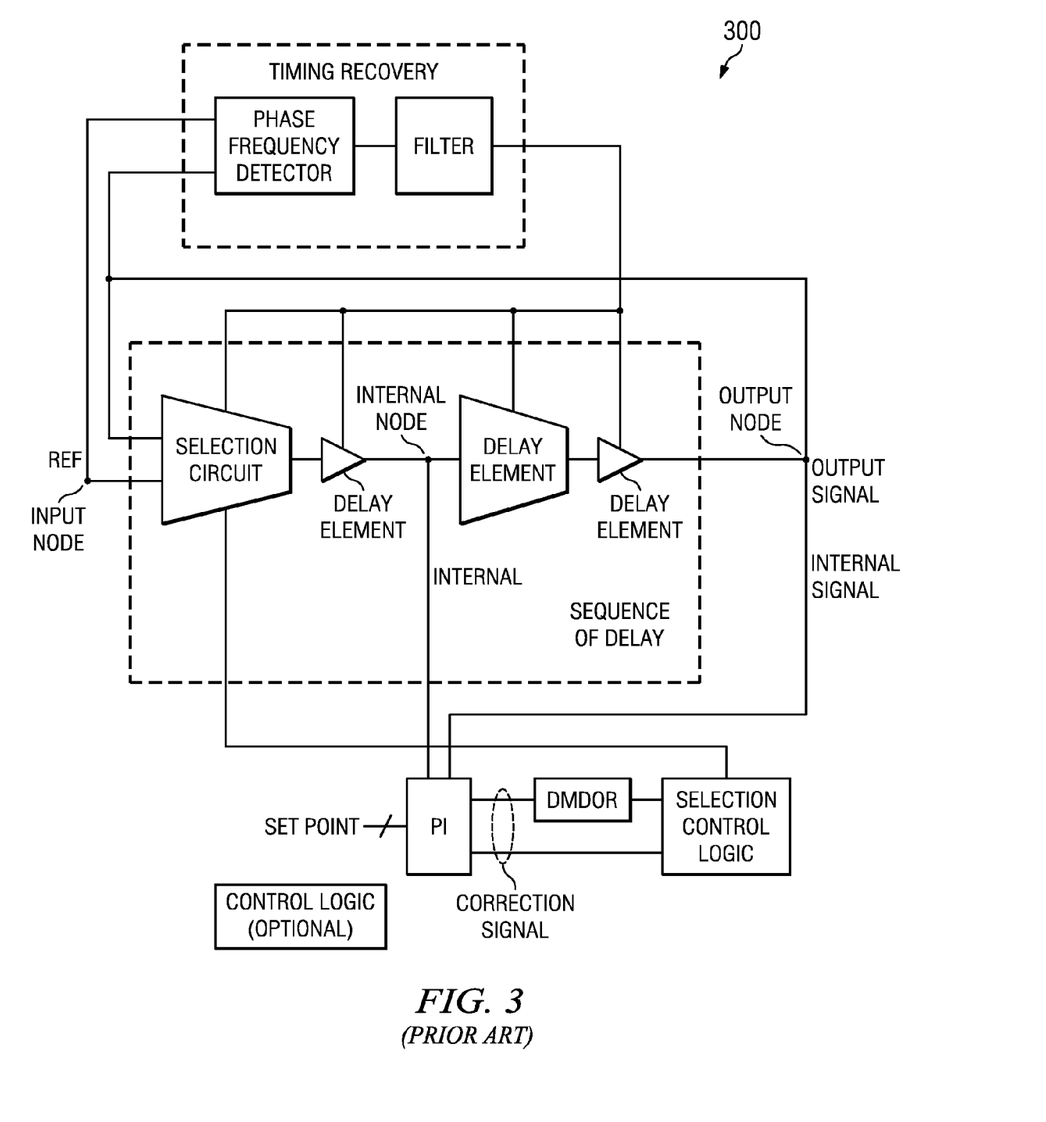
FIG. 3 is an example of a third prior art MDLL.

Turning to FIG. 3, illustrated is an alternative prior art MDLL 300 that attempts to address the problem of spur noise. This MDLL 300, as discussed in U.S. Publication No. 2011/0109356 A1 to Ali, et al. "Aperture Generating Circuit for a Multiplying Delay-Locked Loop". The MDLL 300 adjusts a select signal aperture to reduce a reference spur jitter using phase interpolators. The main disadvantage with this approach is the complexity and power dissipation associated with generating multiple phases using the interpolators and the additional logic to choose the correct phase.

Therefore, there is a need in the art to address at least some of the issues associated with the previous approaches.

SUMMARY

A fist aspect provides: a multiplexor; a phase delay element coupled to an output of the multiplexor and a first input of the multiplexor; a reference clock line coupled to a second input of the multiplexor; a selector that is coupled to a selector input of the multiplexor; a signal divider element coupled to an output of the phase delay element; a variable delay controller coupled to a) the output of the variable delay controller; b) at least one output of the variable element. An integrated phase detector and charge pump element (PDCHP) is coupled to at least: a) an output of the variable delay controller; and b) the selector; c) and a first and second output of the divider element. A capacitor is coupled to an output of the PDCHP, wherein the capacitor is also coupled to a controller input of the phase delay element.

A second aspect provides an apparatus, comprising a multiplexer having a first input and a second input, wherein the first input is coupled to a clock reference line; a phase delay circuit coupled to an output of the multiplexer, wherein an output of the phase delay circuit is coupled to the second input of the multiplexer. A signal divider element is provided that is coupled to the output of the phase delay circuit that generates a divided signal from the output of the phase delay circuit.

The second aspect further provides a variable delay controller, having: a) a first input line coupled to an output of the signal divider that conveys a divided signal; b) a second input line, wherein the second input line conveys, to the variable delay controller, a phase-delayed divided signal of the first divided signal. A selector is provided, coupled to the multiplexer through a selector line, wherein the selector selects among the first input and the second input of the multiplexer. The selector employs at least: a) the output of the phase delay circuit; b) the divided signal; and c) the phase-delayed divided signal, to make the selection between the first input and the second input of the multiplexor.

The second aspect still further employs a phase comparator element, coupled to: a) an output of the variable delay controller; b) the clock reference clock line; c) the output line of the signal divider that conveys the divided signal; and d) the selector line; wherein the phase detector is configured to generate a phase detector signal as derived from signals of at least these four lines (a)-(d), and a current source coupled to at least one output of the phase comparator element, and wherein said current source is controlled by the phase detector element. A phase delay of the phase delay circuit is a function of the current generated by current source.

A third aspect provides an apparatus, comprising: a multiplexer having a first input and a second input, wherein the first input is coupled to a clock reference line; a phase delay circuit coupled to an output of the multiplexer, wherein an output of the phase delay circuit is coupled to the second input of the multiplexer. A signal divider element is provided that is coupled to the output of the phase delay circuit that generates a divided signal from the output of the phase delay circuit.

The third aspect further provides a variable delay controller, having: a) a first input line coupled to an output of the signal divider that conveys a divided signal; b) a second input line, wherein the second input line conveys, to the variable delay controller, a phase-delayed divided signal of the first divided signal. A selector is provided, coupled to the multiplexer through a selector line, wherein the selector selects among the first input and the second input of the multiplexer. The selector employs at least: a) the output of the phase delay circuit; b) the divided signal; and c) the phase-delayed divided signal, to make the selection between the first input and the second input of the multiplexor.

The third aspect still further employs a phase comparator element, coupled to: a) an output of the variable delay controller; b) the clock reference clock line; c) the output line of the signal divider that conveys the divided signal; and d) the selector line; wherein the phase detector is configured to generate a phase detector signal as derived from signals of at least these four lines (a)-(d), and a current source coupled to at least one output of the phase comparator element, and wherein said current source is controlled by the phase detector element. A phase delay of the phase delay circuit is a function of the current generated by current source.

The third aspect still further includes: d) an inverted output select signal. A phase detector element is coupled to: a) an output of the variable delay controller; b) the clock reference clock line; c) the divided signal line; and d) the selector line. The selector circuit further comprises: a selector memory, wherein: a) a first input of the selector memory is coupled to a logical high; and b) a clock input of the selector memory is coupled to the signal divided line; and a clear of the selector memory is derived from a signal conveyed on the select signal line.

BRIEF DESCRIPTION OF THE DRAWINGS

Reference is now made to the following descriptions:

FIG. 4B is an illustration of various signals within the MDLL with spur cancellation of FIG. 4a;

DETAILED DESCRIPTION

Figure 4A:
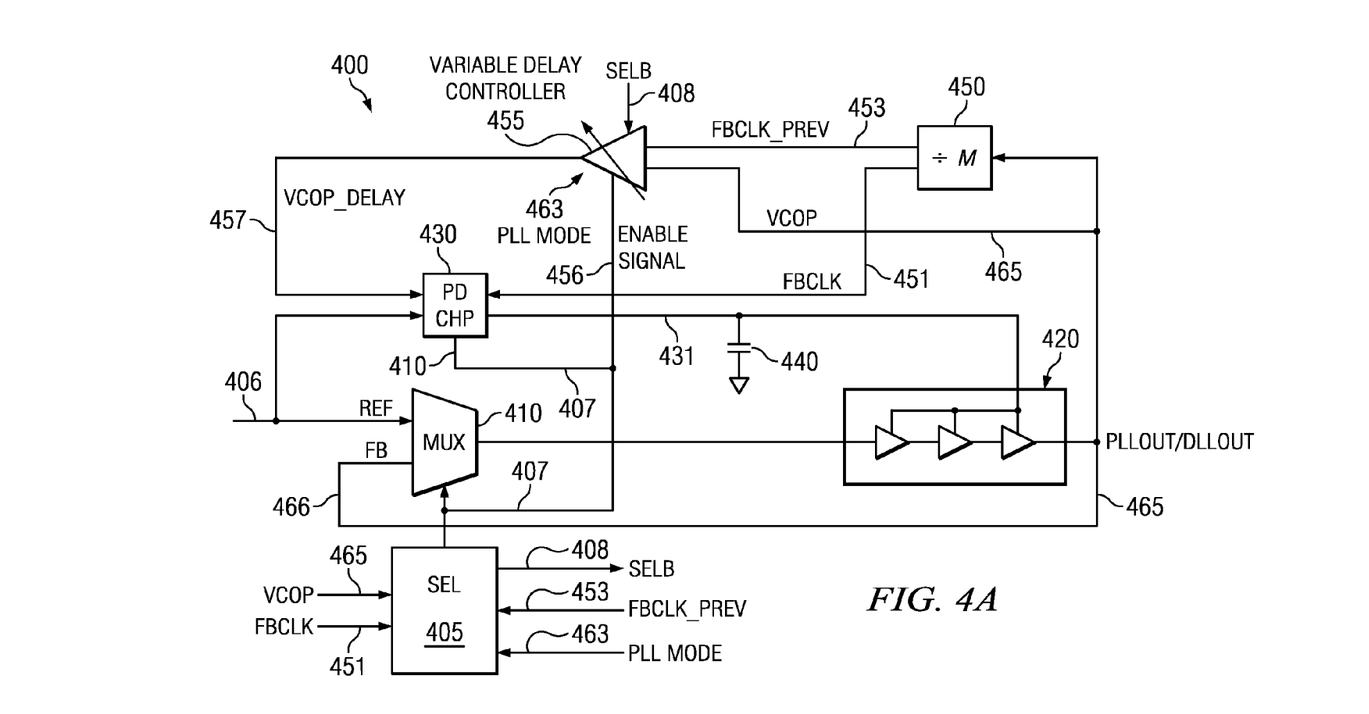
FIG. 4A is an example of an integrated MDLL with spur cancellation/reduction constructed according to the principles of the present application.

Turning to FIG. 4A, illustrated is one embodiment of an MDLL with a reduced or cancelled spur (MDLL) 400. The MDLL 400 includes a multiplexer (MUX) 410 having a first input and a second input. The first input of the MUX 410 is coupled to a clock reference line 406. A phase delay circuit 420 is coupled to a SEL 407 output of the MUX 410. An output 465 PLLOUT of the phase delay circuit 420 is coupled through a feedback line 466 to the second input of the MUX 410.

Figure 4B:
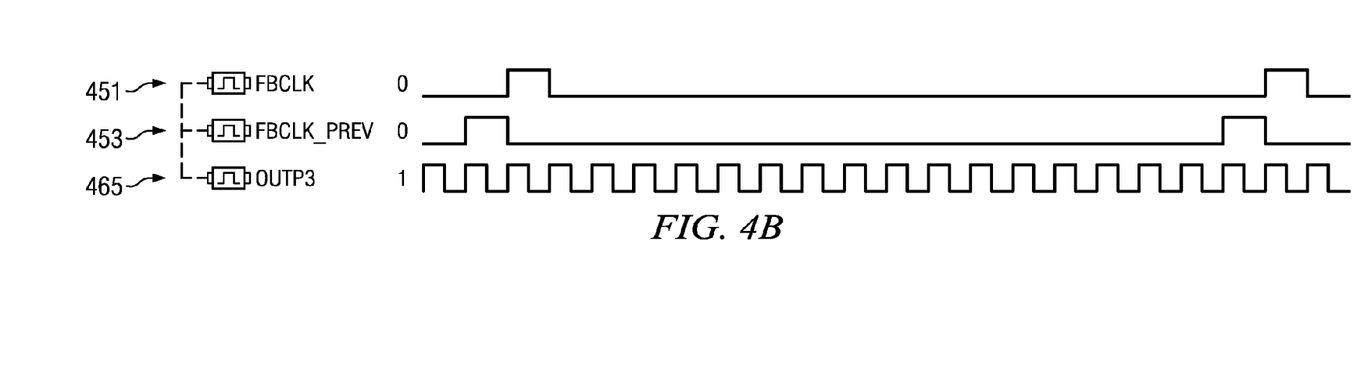

In the MDLL 400, an input of the signal divider element 450 is coupled to the output 465 of the phase delay circuit 420. The signal divider element 450 generates a divided signal from the output 465 of the phase delay circuit 420. Turning briefly to FIG. 4B, illustrated is an example of the output 465 ("OUTP3"), the VCOP, received by the divider 450.

Turning back to FIG. 4A, the MDLL 400 has a variable delay controller 455. The variable delay controller 455 has: a) a first input coupled to the VCOP output 465 of the phase delay circuit 420. The variable delay controller 455 also has: b) an input to receive a second input line 453, wherein the second input line conveys to the variable divider element, a signal FBCLK_PREV of a first divided FBCLK signal, also generated by the signal divider element 450.

Turning again briefly to FIG. 4B, illustrated is an example of a FBCLK signal 451 and a FBCLK_PREV signal 453. In FIG. 4B, the divider ratio between VCOP 465 and the FBCLK signal 451 or FBCLK_PREV 453 is 18:1.

Turning back to FIG. 4A, the variable delay controller 455 also has a coupled PLL mode line 463, which determines whether the MDLL 400 is operating in PLL or MDLL mode. The variable delay controller 455 further has a coupled enable signal 456, which ensures the PDCHP 430 and the variable delay controller are active only when the REF 406 is selected by MUX 410, and also an input inverted select SELB 408 signal, which shall be described in more detail, below.

In FIG. 4A, a selector 405 is coupled to the multiplexer 410 through a selector line 407, wherein the selector 405 selects among the first input 406 and the second feedback input 466 of the MUX 410.

The selector 405 employs at least: a) the VCOP output 465, conveyed across feedback line 466, of the phase delay circuit 420, b) the FBCLK_PREV divided signal 453, and c) the FBCLK signal 451, to make the selection between the first input and the second input of the MUX 410, as shall be described in more detail, below.

In the illustrated embodiment of the MDDL 400, a phase detector element (PD) and a charge pump (CP) are both integrated into one physical element, a PDCHP 430. However, in other embodiments, the phase comparator element and the charge pump are coupled, but not physically integrated, into one physical element.

In the MDLL 400, a first input of the phase comparator element of PDCHP 430 is coupled to a) an output line, VCOP- _DELAY 457, of the variable delay controller 455, b) a second input of the phase comparator of PDCHP 430 is coupled to the clock reference clock line 406; c) a third input of the phase comparator element of PDCHP 430 is coupled to the selector line 407, and b) a fourth input of the phase comparator element of PDCHP 430 is coupled to the FBCLK line 451. In the MDLL 400, the phase detector of the PDCHP 430 is configured to generate a phase detector signal as derived from signals of at least these four lines (a)-(d).

In the MDLL 400, a current source of the PDCHP 430 is coupled to at least one output of the phase detector element of the PDCHP, wherein a current source is controlled by the phase detector element, as will be described in more detail, below. A phase delay of the phase delay circuit 420 is a function of the current generated by current source of the PDCHP 430.

More specifically, a capacitive element 440 is coupled to: an output of the charge pump of the PDCHP 430; and b) a control input of the phase delay circuit 420, wherein the phase delay circuit 420 comprises a plurality of individual phase delay elements 421-423 coupled in series controlled by a voltage of the capacitive element 440.

Generally, in the MDLL 400, the problem of static offset in MDLLs is reduced or cancelled in the MDLL 400 by using the variable delay controller 455. The variable delay controller 455 is controlled in a feedback loop that helps to ensure that a negative edge of a SEL signal of the selector 405 is offset by degrees from a negative edge of the VCO output 465. This condition helps to ensure that the static phase offset is reduced and minimized, resulting in a lower reference spur.

Generally, the MDLL 400 will perform voltage controlled phase delay through a voltage applied to the phase delay circuit 420. The voltage is derived from a current from PDCHP 430, which is in turn derived from various divided down versions of the VCOP 465. However, as will be described in more detail, below, every M cycles, the MDLL 400 recalibrates itself with using the Reference clock received from the reference clock 406 line instead. This recalibrates the MDLL 400 and reduces jitter, thereby reducing a harmonic spur of the MDLL 400.

The principles of the present Application rely on the phase relationship between the SEL (407) signal and the VCOP_DELAY (457) signals to minimize the static offset jitter when in MDLL mode. The circuit can also switch between normal PLL mode and MDLL mode to trade off deterministic (static offset jitter) and random jitter. The selector 405 selects the reference clock line, thereby reducing a static phase offset of the output signal of the phase delay circuit.

In a further embodiment, in the PLL mode 463, the MDLL 400 can be signaled to not update for jitter control, but to always stay in non-updated DLL mode. The phase locked loop mode line 463 is coupled to the variable delay controller 455, and the selector 405 selects a type of output for the device.

Figure 5A:
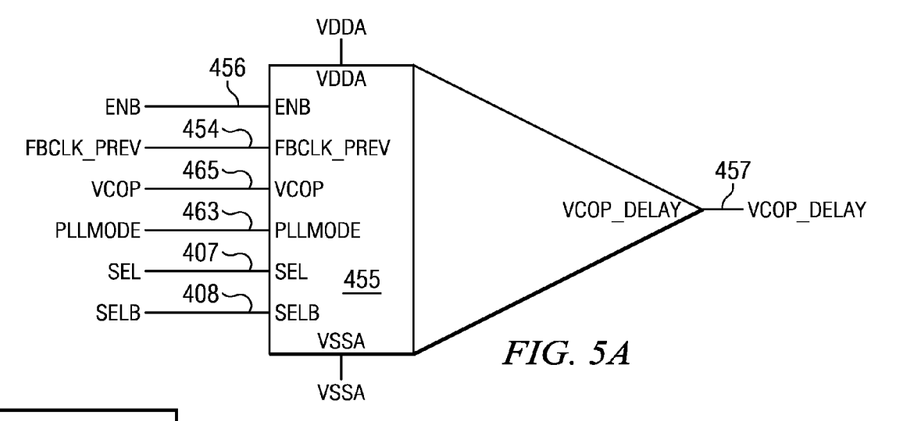
FIG. 5A illustrates inputs and outputs of the variable delay controller of FIG. 4A in more detail.

Turning to FIG. 5A, illustrated are the inputs and outputs of the variable delay controller 455 in more detail. The variable delay controller 455 has input the enable line 456, the FBCLK_PREY line 453 received from the divide M element 450, the VCOP 465 received from the phase delay circuit 420, the PLLMODE 463, the SEL line 407, and the SELB line 408. The variable delay controller 405 then employs these various signals and outputs the VCOP_DELAY signal 457, which is then conveyed to the PDCHP 430 of FIG. 4A to control the phase delay of the phase delay circuit 420.

Figure 5B:
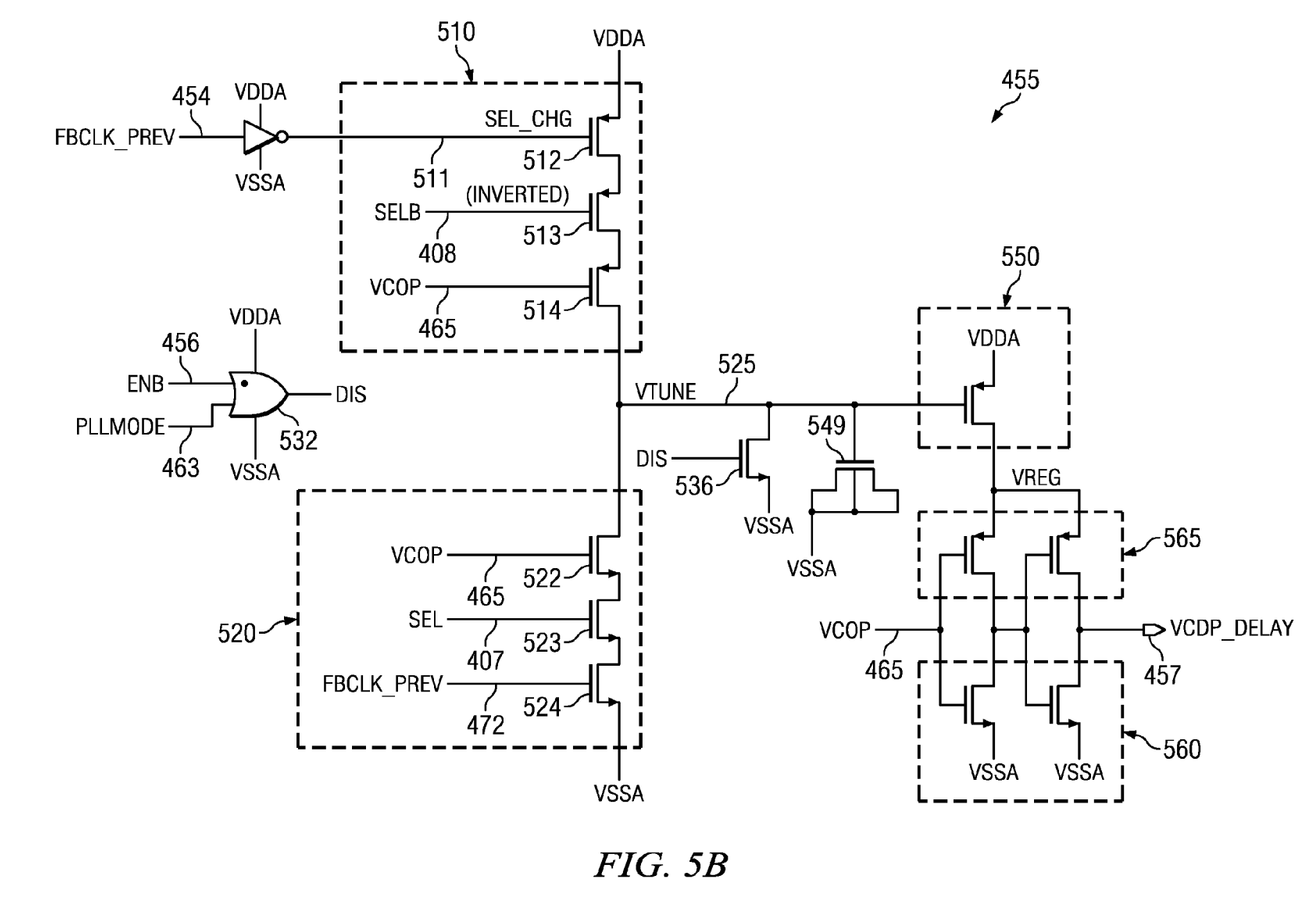
FIG. 5B is an illustration in more detail is the variable delay controller.

Turning to FIG. 5B, illustrated in more detail is the variable delay controller 455.

In the variable delay controller 455, a first set of FET switches 510 includes: a) a gate of a first PFET switch 512 coupled to an inverted signal 511 of the FBCLK_PREV signal 453 signal; b) a gate of a second PFET switch 513 coupled SELB 408; and c) a third PFET switch 514 coupled to the output VCOP 465 of the phase delay circuit 420. The first set of FET switches 510 can act as a current source.

The variable delay controller 455 further comprises: a second set of FET switches 520 including: a) a first NFET switch 522 coupled to the output VCOP 465 of the phase delay circuit 420; b) a second NFET switch 523 coupled to the selector signal line 407; and c) a third NFET 524 switch coupled to the output of the FBCLK_PREY 453. The second set of FET switches 520 can act as a current sink.

The first set of FET switches 510 and the second set of FET switches 520 are coupled together at a VTUNE node 525, more specifically, a source of the third PFET 514 is coupled to a drain of the first NFET 522. Each FET of the first and second set of FET switches 510, 520 are coupled source to drain to one another, from VDDA to VSSA.

In the variable delay controller 455 of FIG. 5B, an enable line 456 and a PLLMODE line 463 are ORed together in an OR logic 532. An output of the OR logic 532 is coupled to a disable NFET 536. The disable NFET 536 has a drain coupled to the VTUNE node 525, and a source coupled to VSSA.

Coupled to VTUNE node 525 is a cathode of a capacitor 549, an anode of which is coupled to VSSA. The cathode of capacitor 549 is then coupled to a gate of a PFET 550, which acts as a variable resistor, as shall be explained below. Coupled to a source of the PFET 550, is a buffer circuit 560, and input of which is the VCOP 465, and an output of which if the VCOP_DELAY 457.

The variable delay controller 455 can work as follows. The VCOP 465 is received at the buffer 560, and after a delay through the buffer 560, is output as VCO DELAY 457. The delay through the buffer 560 is proportional to a voltage across the drain to a source of each individual FET of the buffer 560. The voltage across the drain to the source of each individual FET of the buffer 560 is increased or decreased in proportion to the equivalent resistance of the NFET 550, as a drain of NFET 550 is coupled to VDDA and a source of the bottom FET of the buffer 560 is coupled to VSSA.

The equivalent resistance of the NFET 550 is, in turn, driven by its gate voltage, which is substantially the same as at node VTUNE 549. The voltage at node VTUNE 469, as received at the cathode of the capacitor 549 is driven by the first set of FET switches 510, a current source, and the second set of FET switches 520, a current sink.

If all of the first set of FET switches 510 are closed, then a delay of the variable delay controller 455 increases, and wherein if all of the second set of FET switches 520 are closed, then the delay of the variable delay controller 455 decreases.

This is because if all of the first set of FET switches 510 are closed, this charges the capacitor 549, which increases its voltage, which increases the gate voltage to PFET 550, which decreases the source to drain voltages on the FETS of the buffer circuit 560. This increases the propagation time of a signal from input 465 to output 467.

However, if all of the second set of FET switches 520 are closed, this discharges the capacitor 549, which decreases its voltage, which decreases the gate voltage to PFET 550, which increases the source to drain voltages on the buffer circuit 560. This in turn, decreases the propagation time of a signal from input 465 to output 457.

In the variable delay controller 455, all three FET switches of either the first set of FET switches 510 or the second set of FET switches 520 have to be closed for the VTUNE node 525 to be charged or discharged. Moreover, as the FET switches of the first set of FET switches 510 are PFETs, and the FET switches of the second set of FET switches 520 are NFTS, they will not turn on at the same time, as they both received VCOP 465 on a gate of both the third PFET switch 514 and the first NFET switch 522.

The VCOP signal 465 is delayed such that a falling edge of VCOP is aligned to the center of the SEL high pulse. This helps to guarantee that the UP and DN currents are on for the same time and a stable operating point is reached, minimizing a static offset. This will be further illustrated in FIGS. 11A and 11B.

Figure 6:
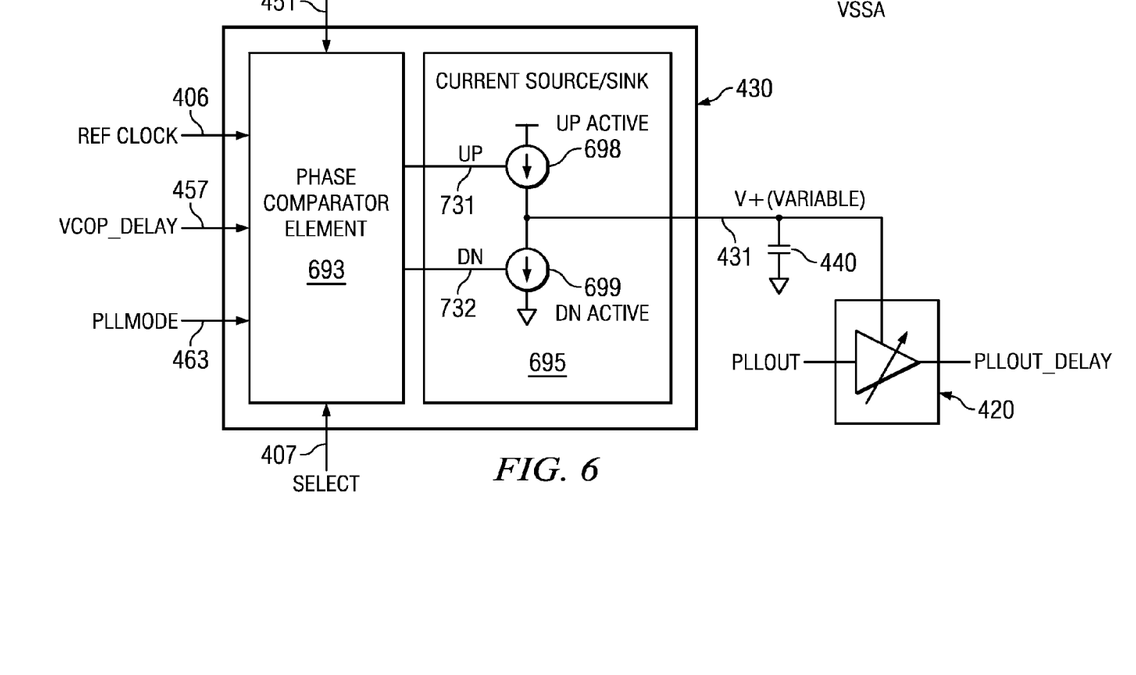
FIG. 6 is an illustration of a phase detector, charge pump and delay circuitry of FIG. 4A in more detail.

Turning now to FIG. 6, illustrated is the PDCHP 430, coupled to phase delay circuit 420, in more detail. The PDCHP 430 comprises a phase comparator element (PCE) 693 and a coupled phase detector current source (PDCS) 695. Coupled as inputs to the phase comparator element 693 are the FBCLK line 451, the REF Clock line 406, the VCOP_DELAY 457, and the SELECT line 407.

A charge up line 631 couples the PCE 693 to an up current source 698, and a charge down line 632 couples the PCE 693 to an down current source (current drain) 699. These current sources 698, 699 are then coupled over a line 431 to a capacitor 440. The capacitor 440, which has a variable voltage according to the current that is sourced or sunk by the PCCS 695, is also coupled to a control input of the phase delay circuit 420. As the voltage across capacitor 430 changes, this changes a voltage applied to the control input of the phase delay circuit 420. This in turn affects a phase delay of the phase delay circuit 420 of a signal received from the MUX 410.

Figure 7A:
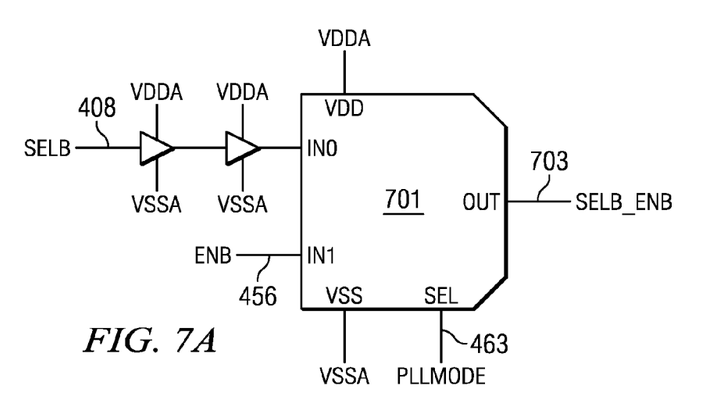
FIG. 7A is an illustration of a phase detector element of FIG. 6 in more detail.

Turning now to FIG. 7A, illustrated is an aspect of the PCE 693 of FIG. 6 in more detail. The SELB 408 signal, which is the complement of SEL 407 signal, is received as a first input of a MUX PCE 701 of the PCE 693. The enable signal line 456 is received as a second input of the MUX PCE 701. The PLLMODE 463 is employed as an input selection signal by the MUX PCE 701. The selected output of the MUX PCE 701 is then conveyed as a SELB_ENB 703 line signal.

In the MUX PCE 701, if the PLLMODE 463 is on DLL (i.e. equals zero), then SELB is conveyed as SELB_ENB 703. However, if PLLMODE is on PLL (i.e. equals one) then the ENB 456 signal is conveyed. If ENB 456 is on and PLLMODE equals one, then the MDLL 400 operates as a PLL. However, if ENB 465 is off and PLLMODE equals one, then PLL is disabled.

Figure 7B:
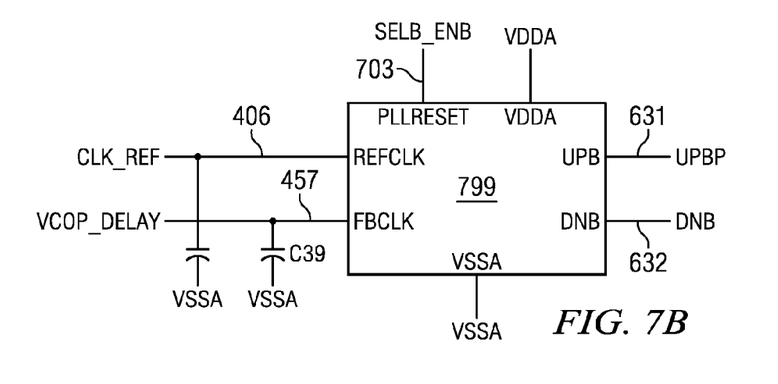
FIG. 7B illustrates various inputs and outputs of a PCE driver of the PCE of FIG. 7A.

FIG. 7B illustrates various inputs and outputs of a PCE driver 799 of the PCE 693. The PCE driver 799 receives the SELB_ENB 703 from the MUX PCE 701 to choose among a reference clock line signal 406 and the VCOP_DELAY line 457. As outputs, the PCE driver 799 has the first driver line 631 to the current source 698 and the second driver line 632 to the current sink 699.

Figure 7C:
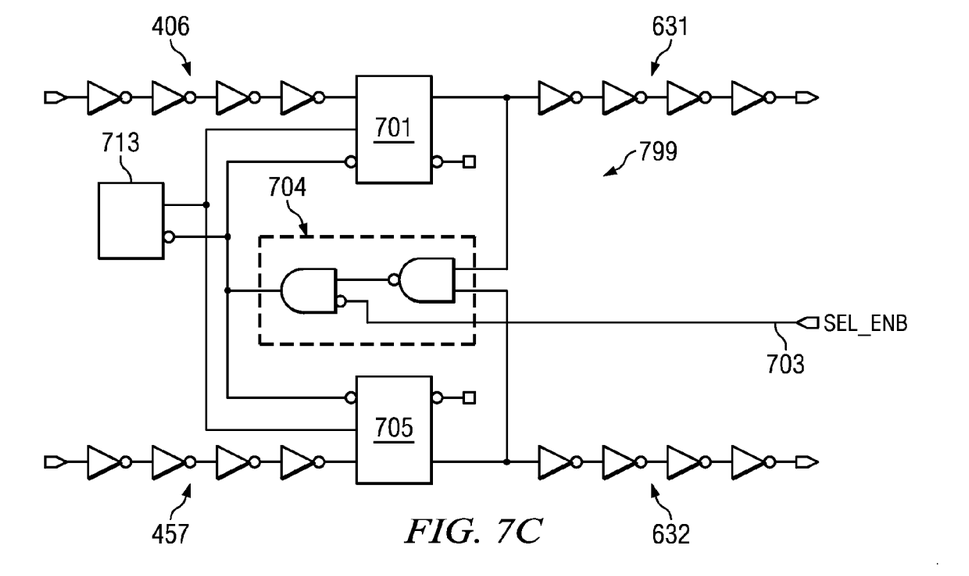
FIG. 7C is an illustration of inputs and outputs of a phase control element driver of the phase control element.

FIG. 7C illustrates PCE driver 799 in more detail. The REF clock line 406 and the VCOP_DELAY line 457 are each received as inputs at a memory element, a first and second D flip flop 701 and 705, respectively. A static high signal source 713 is coupled into the D flip flops 701 and 705 data input. The SEL_ENB 703 is coupled, after a delay stage 704, into the clear inputs of the D flip flops 701, 705.

Generally, the PCE driver 799 can work as follows. The outputs on charge up line 631 and charge down line 632 are reset every Mth VCOP 465 cycle, i.e. a VCOP_DELAY signal (based on the SELB signal) in MDLL mode. More specifically, both a conveyance of the clock 406 signal is cleared/reset to zero, and the divide M element output line 457 signal 457 is reset to zero, after a delay of SEL_ENB through the delay circuit 704, thereby reducing offset jitter.

A rising edge on 406 sets the output 631 high. However this only occurs when 703 is low (SEL is high). Similarly when 457 goes high the output of 705, signal 632, goes high provided 703 is low. Once both 631 and 632 are high, the flops 701 and 705 are cleared after a delay due to 704. The duration when 631 and 632 are high determines the phase error between 406 and 457. The up and down current source 698 and 699 are turned on for those durations and charge or discharge node 431. At equilibrium, the durations when 631 and 632 are high become equal and the phase error between 406 and 457 is minimized, resulting in phase lock.

Figure 8A:
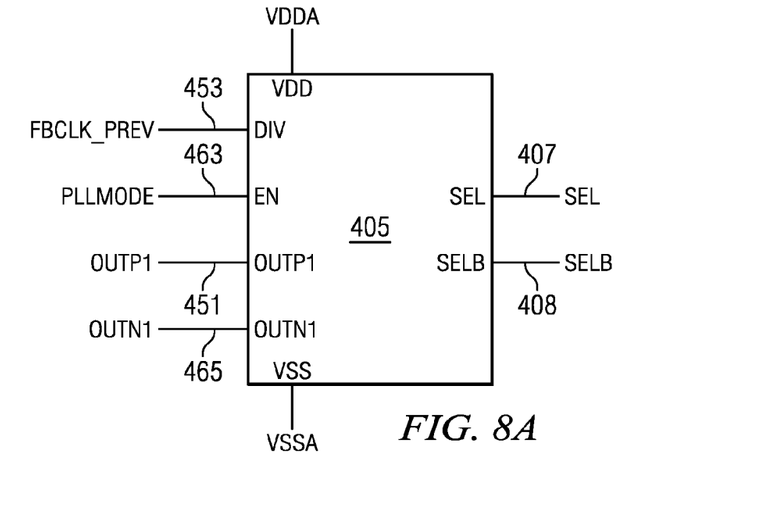
FIG. 8A is an illustration of the input and output lines of the selector of FIG. 4A.

FIG. 8A illustrates an embodiment of the selector 405 with inputs and outputs. Selector 805 has inputted thereinto: a) the FBCLK_PREV line signal 453, b) the PLLMODE line 463, c) the FBCLK line 451, and d) the VCOP output line 465. The selector 405 outputs a selection value SEL on the SEL 407 line and an inverted selection value, SELB, on the SELB 408 line, according to these signals (a)-(d).

Figure 8B:
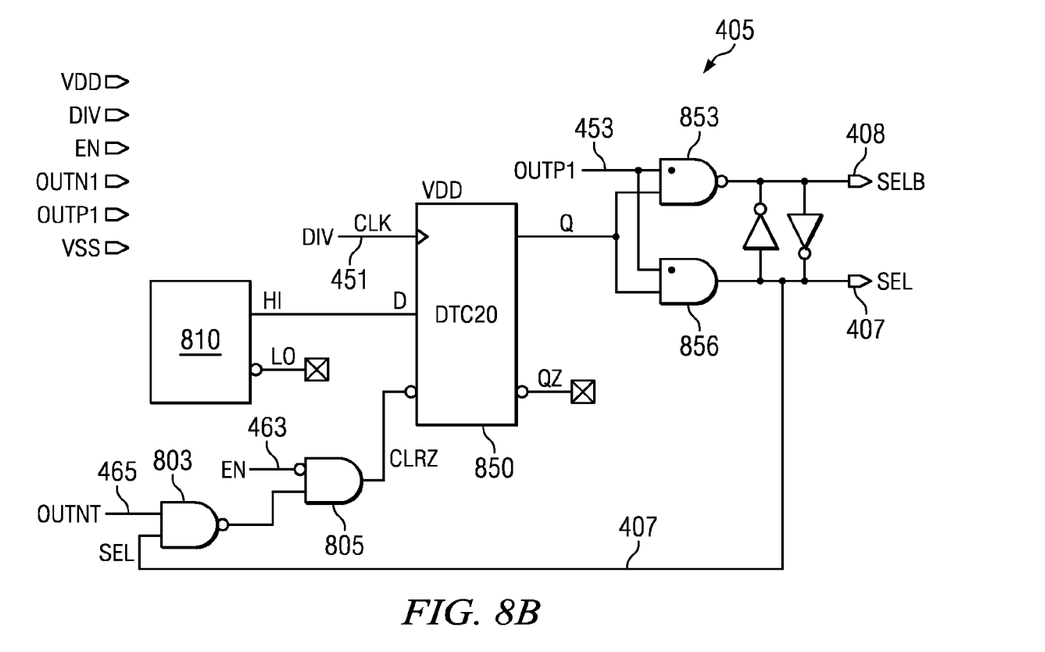
FIG. 8B is an illustration the selector of FIG. 4A in more detail.

FIG. 8B discloses the selector 805 in more detail.

The VCOP signal line 465 is coupled to a first input of a NAND 803 and the SEL value is coupled to a second input of the NAND 803 through a selector feedback line. The PLL_MODE line 463 is coupled to a first input of an AND 805. An output of the NAND 803 is coupled to a second input of the AND 805. An output of the AND 805 is coupled into an inverted clear input of a D flip-flop 850.

A FBCLK line 451 is coupled into the clock of the D flip-flop 850. A high signal source 810 is coupled into an signal input of the D flip flop 850.

A FBBCLK_PREV signal of the FBCLK_PREV line 453 is coupled into a first input of a NAND 853 and a first input of an AND 856. An output of D flip-flop 850 is coupled into the NAND 853 and the AND 856. An output of the AND 856 is the SEL 407, and an output of the NAND 853 is SELB 408.

The divided clock signal, FBCLK on FBCLK line 451 produces a high output on Q every Mth cycle. As a result, the SEL signal is activated every Mth cycle and is deactivated after one VCO clock cycle due to a CLRZ signal being activated once SEL 407 and PLLOUT 465 are high.

Figure 9:
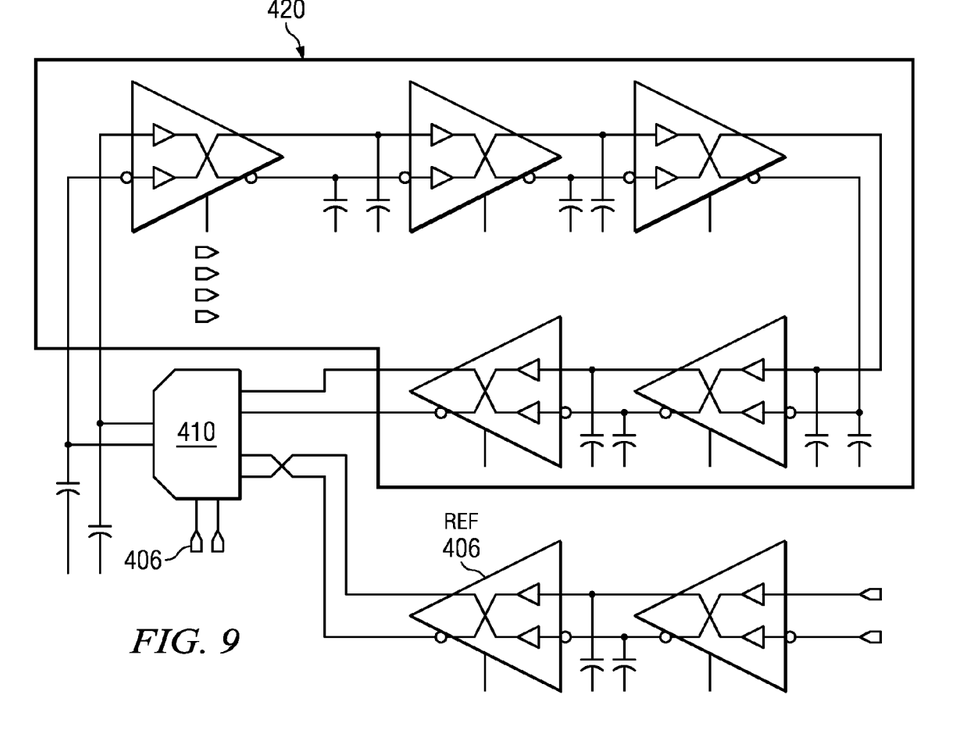
FIG. 9 is an illustration of one embodiment of a coupling between the MUX 410 and the delay circuitry of FIG. 4A.

FIG. 9 illustrates a coupling between the MUX 410 and the delay circuitry 420. The MUX 410 is selected by the SEL 407. The MUX 410 has as inputs the delay circuitry 420 or the reference clock 406.

Figure 10:
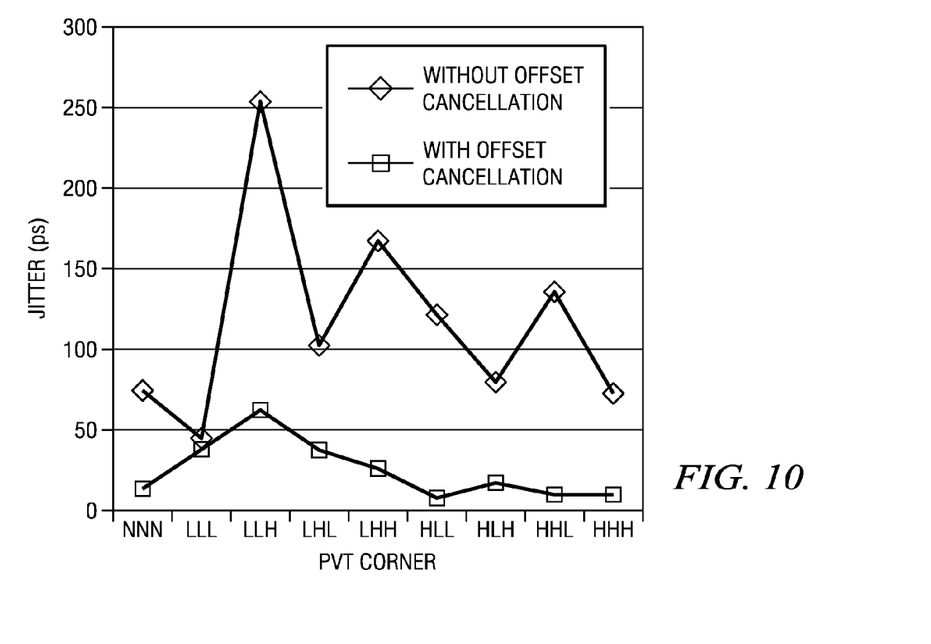
FIG. 10 is an illustration of a simulation of how the offset cancellation through employment of the variable delay controller and its supporting circuitry in the rest of the MDLL of FIG. 4A decreases the offset jitter.

FIG. 10 illustrates a simulation of how the offset cancellation through employment of the variable delay controller 455, and its supporting circuitry in the rest of the MDLL 400, decreases the offset jitter (ps is in picoseconds). A significant reduction in jitter is observed when the offset cancellation circuit is engaged across all process/voltage/temperature (PVT) corners.

Figure 11A:
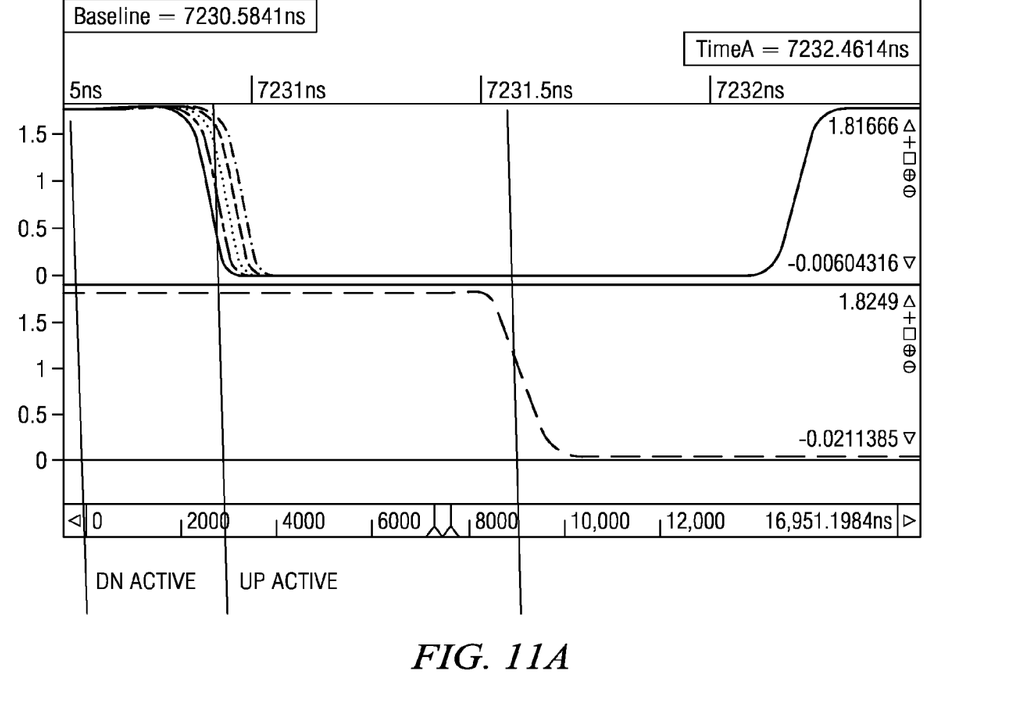
FIG. 11A is an illustration of the timing diagram associated with the delay adjustment circuit in FIG. 6 generated from a circuit simulator.

FIG. 11A illustrates a timing diagrams obtained from a circuit simulation showing the relationship between the VCOP (top) and SEL (bottom signals). In order to minimize a static phase error, the falling edge of VCOP is delayed so that it falls in the center of the SEL high pulse.

Figure 11B:
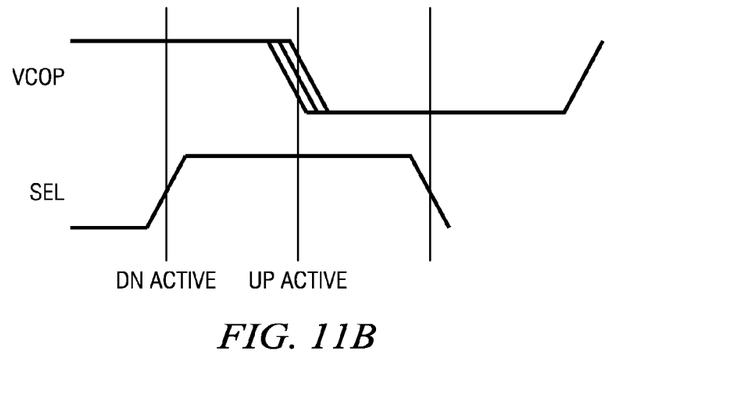
FIG. 11B is an illustration of the timing diagram associated with the delay adjustment circuit in FIG. 6 showing the relationships over an entire cycle of the SEL and VCOP signals, when the UP and DN paths transition.

FIG. 11B is an illustration of another timing diagram associated with the delay adjustment circuit in FIG. 6 showing the relationships over an entire cycle of the SEL and VCOP signals, except that it shows the entire SEL signal high pulse and the regions where the UP and DN currents are active.

Those skilled in the art to which this application relates will appreciate that other and further additions, deletions, substitutions and modifications may be made to the described embodiments.

What is claimed is:

1. An apparatus, comprising:
   a multiplexor;
   a phase delay element coupled to an output of the multiplexor and a first input of the multiplexor;
   a reference clock line coupled to a second input of the multiplexor;
   a selector that is coupled to a selector input of the multiplexor;
   a signal divider element coupled to an output of the phase delay element;
   a variable delay controller coupled to
      a) the output of the variable delay controller;
      b) at least one output of the variable element;
   an integrated phase detector and charge pump element (PDCHP) coupled to at least:
   a) an output of the variable delay controller; and
   b) the selector;
   c) and a first and second output of the divider element;
   a capacitor coupled to an output of the PDCHP, wherein the capacitor if also coupled to a controller input of the phase delay element.

2. The apparatus of claim 1, wherein the phase delay circuit comprises a plurality of phase delay elements coupled in series each controlled by a voltage of the capacitive element.

3. The apparatus of claim 1, wherein the selector circuit further comprises:
   a selector memory, wherein:
      a) a first input of the selector memory is coupled to a logical high; and
      b) a clock input of the selector memory is coupled to the signal divided line; and
      a clear of the selector memory is derived from a signal conveyed on the select signal line.

4. The apparatus of claim 1, wherein an output of the selector is combined with the output of the variable delay controller to generate a select signal of the select line.

5. The apparatus of claim 1, further comprising:
   a current source coupled to at least one output of the phase comparator element, and wherein said current source is controlled by the phase detector element; and
   wherein a phase delay of the phase delay circuit is a function of the current generated by current source.

6. The apparatus of claim 5, further comprising a phase locked loop mode line coupled to the variable delay controller and the selector that selects a phase locked output for the device.

7. The apparatus of claim 1, wherein the selector selects the reference clock line, thereby reducing a static phase offset of the output signal of the phase delay circuit.

8. An apparatus, comprising:
   a multiplexer having a first input and a second input, wherein the first input is coupled to a clock reference line;
   a phase delay circuit coupled to an output of the multiplexer, wherein an output of the phase delay circuit is coupled to the second input of the multiplexer;
   a signal divider element coupled to the output of the phase delay circuit that generates a divided signal from the output of the phase delay circuit,
   a variable delay controller, having:
      a) a first input line coupled to an output of the signal divider that conveys a divided signal;
      b) a second input line, wherein the second input line conveys to the variable divider element, a phase-delayed divided signal of the first divided signal;
   a selector coupled to the multiplexer through a selector line, wherein the selector selects among the first input and the second input of the multiplexer, wherein the selector employs at least:
      a) the output of the phase delay circuit;
      c) the divided signal;
      b) the phase-delayed divided signal;
         to make the selection between the first input and the second input of the multiplexor;
   a phase comparator element, coupled to:
      a) an output of the variable delay controller;
      b) the clock reference clock line;
      c) the output line of the signal divider that conveys the divided signal; and
      d) the selector line;
   wherein the phase detector is configured to generate a phase detector signal as derived from signals of at least these four lines (a)-(d), and
   a current source coupled to at least one output of the phase comparator element, and wherein said current source is controlled by the phase detector element; and
   wherein a phase delay of the phase delay circuit is a function of the current generated by current source.

9. The system of claim 8, further comprising: a capacitive element coupled to:
   a) an output of the phase comparator element; and
   b) a control input of the phase delay circuit,
      wherein the phase delay circuit comprises a plurality of phase delay elements coupled in series controlled by a voltage of the capacitive element.

10. The apparatus of claim 8, wherein the selector selects the reference clock line, thereby reducing a static phase offset of the output signal of the phase delay circuit.

11. The apparatus of claim 8, wherein the variable delay controller comprises:
   a first set of FET switches including:
      a) a first PFET switch coupled to an inverted signal of the phase-delayed divided signal;
      b) a second PFET switch coupled to an inverted signal of the selector line; and
      c) a third PFET switch coupled to the output of the phase delay circuit.

12. The apparatus of claim 11, wherein the variable delay controller further comprises:
   a second set of FET switches including:
      a) a first NFET switch coupled to an inverted signal of the phase-delayed divided signal;
      b) a second NFET switch coupled to an inverted signal of the selector line; and
      c) a third NFET switch coupled to the output of the phase delay circuit.

13. The apparatus of claim 12, wherein if all of the first set of FET switches are closed, then a delay of the delay element increases, and wherein if all of the second set of FET switches are closed, then the delay of the delay element decreases.

14. An apparatus, comprising:
   a multiplexer having a first input and a second input, wherein the first input is coupled to a clock reference line;
   a phase delay circuit coupled to an output of the multiplexer, wherein an output of the phase delay circuit is coupled to the second input of the multiplexer;
   a signal divider element coupled to the output of the phase delay circuit that generates a divided signal from the output of the phase delay circuit,
   a variable delay controller, having:

a) a first input coupled to an output of the signal divider that conveys a divided signal;
b) a second input line, wherein the second input line conveys to the variable divider element, a phase-delayed divided signal of the first divided signal;
a selector coupled to the multiplexer through a selector line, wherein the selector selects among the first input and the second input of the multiplexer, wherein the selector employs at least:
a) the output of the phase delay circuit;
c) the divided-signal;
b) the phase-delayed divided signal;
to make the selection of the input of the multiplexor; and
wherein an inverted selector line of the multiplexor is coupled to a
a phase detector element, coupled to:
a) an output of the variable delay controller;
b) the clock reference clock line;
c) the output line of the signal divider; and
d) the selector line;
wherein the phase detector is configured to generate a phase detector signal as derived from signals of at least these four lines (a)-(d),
a current source coupled to at least one output of the phase comparator element, and wherein said current source is controlled by the phase detector element; and
wherein a phase delay of the phase delay circuit is a function of the current generated by current source; and
wherein the phase detector element further comprises:
an input of a first memory element coupled to the reference clock line, an output of which is coupled to the current source
an input of the second memory element coupled to the variable delay output line; an output of which is coupled to a current sink of the current source;
and wherein both memory elements can be reset by the coupled selector circuit.

15. The system of claim 14, further comprising: a capacitive element coupled to:
a) an output of the phase comparator element; and
b) a control input of the phase delay circuit,
wherein the phase delay circuit comprises a plurality of phase delay elements coupled in series controlled by a voltage of the capacitive element.

16. The system of claim 15, further comprising wherein the first memory element and the second memory elements are D flip flops.

17. The system of claim 16, further comprising a delay element coupled to a resent of both the first and second memory element.

18. The system of claim 14, wherein the phase detector further includes:
a phase detector multiplexor, wherein:
a) a first input of the phase detector mux is coupled to the selector through an inverted selector line; and
b) a second input of the phase detector multiplexor is coupled to the enable line.

19. The system of claim 18, further comprising a phase detector driver, wherein the phase detector driver is coupled to an output of the phase detector multiplexor, and wherein the phase detector driver drives the current source.

20. The system of claim 18, wherein the selector selects the reference clock line, thereby reducing a static phase offset of the output signal of the phase delay circuit.

\* \* \* \* \*